(12) United States Patent
Stegers et al.

(10) Patent No.: US 12,323,111 B2
(45) Date of Patent: Jun. 3, 2025

(54) PROTECTION CIRCUIT AND METHOD

(71) Applicant: NXP B.V., Eindhoven (NL)

(72) Inventors: Marc Gerardus Maria Stegers, Berkel en Rodenrijs (NL); Gian Hoogzaad, Mook (NL); Alexander Simin, Nijmegen (NL)

(73) Assignee: NXP B.V., Eindhoven (NL)

( * ) Notice: Subject to any disclaimer, the term of this patent is extended or adjusted under 35 U.S.C. 154(b) by 577 days.

(21) Appl. No.: 17/658,010

(22) Filed: Apr. 5, 2022

(65) Prior Publication Data

US 2022/0329214 A1 Oct. 13, 2022

(30) Foreign Application Priority Data

Apr. 9, 2021 (EP) ..................................... 21167721

(51) Int. Cl.
*H03F 1/52* (2006.01)
*H03F 3/195* (2006.01)

(52) U.S. Cl.
CPC .............. *H03F 1/52* (2013.01); *H03F 3/195* (2013.01); *H03F 2200/294* (2013.01); *H03F 2200/435* (2013.01); *H03F 2200/451* (2013.01)

(58) Field of Classification Search
CPC ...... H03F 1/52; H03F 3/195; H03F 2200/294; H03F 2200/435; H03F 2200/451
(Continued)

(56) References Cited

U.S. PATENT DOCUMENTS 4,654,587 A 3/1987 Murphy
8,854,130 B2 * 10/2014 Coban ..................... H03F 1/223
330/140

(Continued)

OTHER PUBLICATIONS

Linares-Barranco, B. et al.; "A Precise 90 Quadrature OTA-C Ocillator Tunable in the 50-130 MHz Range"; IEEE Trans. On circuits and Systems, vol. 51, No. 4; 15 pages (Apr. 2004).

*Primary Examiner* — Hafizur Rahman

(57) ABSTRACT

A protection circuit and method for protecting driven circuitry against voltage peaks in a radio frequency signal, "$V_{RF}$", past a predetermined voltage level "$V_{detect}$". The protection circuit includes an input for receiving the radio frequency signal. The protection circuit also includes at least one amplification stage coupled to the input. The amplification stage is operable to produce an amplified signal based on $V_{detect}-V_{RF}$. The protection circuit further includes a hold circuit operable to determine, from the amplified signal produced by the amplification stage, whether a peak voltage $V_{peak}$ of the radio frequency signal exceeds $V_{detect}$. The hold circuit is operable to output a first detection value if $V_{peak}$ exceeds $V_{detect}$. The hold circuit is operable to output a second detection value if $V_{peak}$ does not exceed $V_{detect}$. The protection circuit also includes a latch circuit operable to latch the detection value outputted by the hold circuit.

16 Claims, 6 Drawing Sheets

(58) Field of Classification Search
USPC .......................................................... 330/298
See application file for complete search history.

(56) References Cited

U.S. PATENT DOCUMENTS

| | | | |
|---|---|---|---|
| 9,088,257 B2* | 7/2015 | Vice | H03F 1/0205 |
| 9,559,639 B2* | 1/2017 | Su | H03F 3/24 |
| 9,939,467 B1 | 4/2018 | Ciubotaru | |
| 2012/0034895 A1* | 2/2012 | Xuechu | H03K 5/1532 |
| | | | 455/341 |
| 2013/0342274 A1 | 12/2013 | Coban et al. | |
| 2015/0236658 A1* | 8/2015 | Nash | H03F 1/52 |
| | | | 330/298 |

\* cited by examiner

PROTECTION CIRCUIT AND METHOD

CROSS-REFERENCE TO RELATED APPLICATIONS

This application claims the priority under 35 U.S.C. § 119 of European patent application no. 21167721.6, filed Apr. 9, 2021 the contents of which are incorporated by reference herein.

BACKGROUND

The present specification relates to a protection circuit and method for protecting driven circuitry against voltage peaks in a radio frequency signal.

Peak detectors may be used to detect signal (e.g. RF signal) peaks, thereby to attempt to avoid undesired high output power levels, so as to protect the driven circuitry against non-reversable breakdown.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a protection circuit for protecting driven circuitry against voltage peaks in a radio frequency signal, "$V_{RF}$", past a predetermined voltage level "$V_{detect}$", the protection circuit comprising:
 an input for receiving the radio frequency signal;
 at least one amplification stage coupled to the input for producing an amplified signal based on $V_{detect}-V_{RF}$;
 a hold circuit operable to determine, from the amplified signal produced by the at least one amplification stage, whether a peak voltage $V_{peak}$ of the radio frequency signal exceeds $V_{detect}$ and to output:
  a first detection value if $V_{peak}$ exceeds $V_{detect}$; and
  a second detection value if $V_{peak}$ does not exceed $V_{detect}$; and
 a latch circuit operable to latch the detection value outputted by the hold circuit.

According to another aspect of the present disclosure, there is provided a method of protecting driven circuitry against voltage peaks in a radio frequency signal, "$V_{RF}$", past a predetermined voltage level "$V_{detect}$", the method comprising:
 receiving the radio frequency signal;
 producing an amplified signal based on $V_{detect}-V_{RF}$;
 determining, from the amplified signal, whether a peak voltage $V_{peak}$ of the radio frequency signal exceeds $V_{detect}$; and
 latching:
  a first detection value if $V_{peak}$ exceeds $V_{detect}$; and
  a second detection value if $V_{peak}$ does not exceed $V_{detect}$.

Embodiments of this disclosure may provide for fast peak detection in a manner that need not load does not load the RF signal. Embodiments of this disclosure may provide for peak detection in a manner which does not add a load to the circuit and/or which may require no feedback element to detection process (which may otherwise slow the operation of the detection circuit due to the latency introduced by the feedback loop). The use of the latched detection value can allow the detection process to be implemented without requiring the actual peak level voltage to be determined. Instead, the latched detection value indicates whether the peak voltage $V_{peak}$ exceeds a predetermined level $V_{detect}$ (which may be set according to the protection required by the driven circuitry). This can allow the protection circuit to react more swiftly when potentially damaging peak level voltages appear in the radio frequency signal.

For the purposes of this disclosure, the terms "exceed" and "exceeds" refer to $V_{RF}$ exceeding a detection level $V_{detect}$ in the sense that, for a positive part of the $V_{RF}$ waveform (positive peak), $V_{RF}>V_{detect}$ and/or, for a negative part of the $V_{RF}$ waveform (negative peak), $V_{RF}<V_{detect}$.

The protection circuit may include a plurality, N, of amplification stages arranged in a linear chain. The plurality of amplification stages may include a first amplification stage coupled to the input. The plurality of amplification stages may also include an $N^{th}$ amplification stage having an output operable to output the amplified signal based on $V_{detect}-V_{RF}$.

The amplification stages may include at least one intermediate amplification stage coupled between the first amplification stage and the $N^{th}$ amplification stage in the linear chain.

Each amplification stage of the N amplification stages may be a differential amplification stage including a pair of inputs and a pair of outputs.

The pair of inputs of the first amplification stage may include a first input coupled to the input of the protection circuit. The pair of inputs of the first amplification stage may also include a second input coupled to a reference voltage determined by $V_{detect}$.

The first input may be programmably biasable for maintaining a linear region of the first amplification stage at a desired common mode level.

The reference voltage may be programmable.

The pair of inputs of each intermediate amplification stage may be coupled to the pair of outputs of a preceding amplification stage in the linear chain.

The hold circuit may have a differential input. The pair of outputs of the $N^{th}$ amplification stage may be coupled to the differential input of the hold circuit.

A low noise amplifier may be coupled to receive the radio frequency signal. The amplification stage may be coupled to an output of the low noise amplifier.

The hold circuit may include an output for outputting the detection value to the latch circuit. The hold circuit may include an RC network for setting a transition time of the hold circuit between the second detection value and the first detection value.

The RC network may include a capacitor operable, based on the amplified signal outputted by the amplification stage, to:
 remain uncharged while $V_{peak}$ does not exceed $V_{detect}$; and
 charge when $V_{peak}$ exceeds $V_{detect}$, for driving the detection value outputted by the hold circuit to the second detection value over a time period determined by a time constant of the RC network.

The latch circuit may include an output operable to output a control signal for enabling/disabling an output stage of the protection circuit according to the latched detection value.

The protection circuit may further include a programmable attenuator for attenuating the radio frequency signal according to the latched detection value.

The protection circuit may be operable to protect driven circuitry against voltage peaks in a radio frequency signal, "$V_{RF}$", past a plurality of different predetermined voltage levels "$V_{detect}$". The protection circuit may thus include:

a plurality of respective sets of one or more amplification stages coupled to the input, each set for producing an amplified signal based on $V_{detect}-V_{RF}$ for each different respective predetermined voltage level;

a plurality of respective hold circuits, each operable to determine, from the amplified signal produced a respective one of the sets of one or more amplification stages, whether a peak voltage $V_{peak}$ of the radio frequency signal exceeds the respective predetermined voltage level for that set and to output:

a first detection value if $V_{peak}$ exceeds $V_{detect}$ for that set of one or more amplification stages; and a second detection value if $V_{peak}$ does not exceed $V_{detect}$ for that set of one or more amplification stages; and a plurality of respective latch circuits, each operable to latch the detection value outputted by a respective one of the hold circuits.

For the purposes of this disclosure, a radio frequency, "RF", signal may be considered to be a signal having a frequency in the range 20 kHz-300 GHz.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
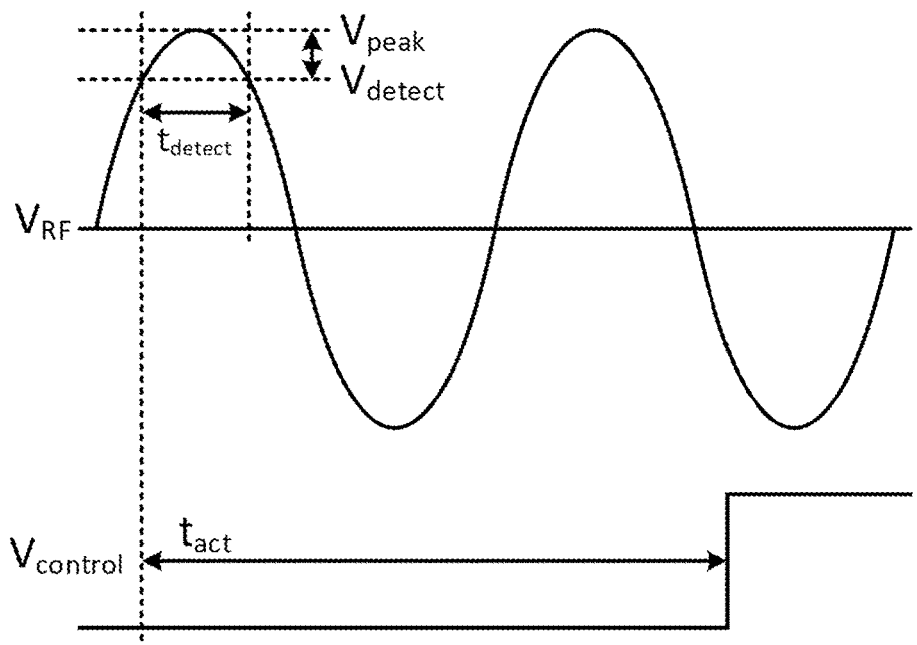
FIG. 1 illustrates an example of peak detection in an RF signal.

FIG. 1 illustrates an example of peak detection in an RF signal ($V_{RF}$) according to an embodiment of this disclosure. For illustrative purposes, the RF signal is assumed to be a simple sine wave, although it will be appreciated that embodiments of this disclosure would be applicable to RF signals having other waveforms.

In FIG. 1, the following parameters are denoted:

$V_{RF}$ is the voltage associated with the RF signal as a function of time;

$V_{peak}$ is the peak voltage of $V_{RF}$;

$V_{detect}$ is a detection level, above which embodiments of this disclosure may determine that $V_{RF}$ is peaking above a voltage that is considered to be too high, bearing in mind the aim of protecting driven circuitry (e.g. against non-reversable breakdown);

$V_{detect}$ may be considered to be a threshold voltage, beyond which damage to the driven circuitry might occur;

$t_{detect}$ is the time that $V_{RF}$ spends above the detection level $V_{detect}$;

$V_{control}$ is a control signal that is to be asserted for taking action to protect the driven circuitry, once $V_{RF}$ has exceeded $V_{detect}$; and $t_{act}$ is the time taken for $V_{control}$ to be transitioned/asserted, once $V_{RF}$ has exceeded $V_{detect}$.

Note that $t_{act}$ may exceed the period T of the RF signal, such that $V_{RF}$ may exceed $V_{detect}$ more than once before V control is asserted for protecting the driven circuitry.

Embodiments of this disclosure may allow for swift detection and assertion of the control signal V control, once $V_{RF}$ crosses $V_{detect}$. This goal may be complicated by the fact that $V_{RF}$ may only spend a short time above $V_{detect}$ (that is to say, $t_{detect}$ may be small).

The complexity associated with the task of swift detection and assertion of the control signal $V_{control}$ may be largely determined by the accuracy required and the frequency of the signal to be detected ($V_{RF}$):

$$\text{Accuracy}_{dB} = 20 \cdot \log_{10}\left(\frac{V_{peak}}{V_{detect}}\right)$$

Note that the expression shown above is valid for values of $V_{peak}$ which are equal to or higher than $V_{detect}$ (i.e. $V_{peak} \geq V_{detect}$), and $t_{detect}$ may be expressed as:

$$t_{detect} = 2 \cdot \left(\frac{90° - \arcsin\left(\frac{V_{detect}}{V_{peak}}\right)}{360°} \cdot \frac{1}{\text{frequency}}\right)$$

$$= 2 \cdot \left(\frac{90° - \arcsin\left(\frac{1}{10^{\frac{\text{Accuracy}_{dB}}{20}}}\right)}{360°} \cdot \frac{1}{\text{frequency}}\right)$$

In accordance with embodiments of this disclosure, $V_{control}$ may be transitioned/asserted within the time $t_{act}$, such that appropriate action can be taken in response to the detected signal $V_{RF}$ crossing $V_{detect}$ for protecting the driven circuitry. As noted previously, it is possible that $t_{act}$ may include multiple signal periods of $V_{RF}$. In accordance with embodiments of this disclosure, it has been realized that this fact may be used to the advantage of a protection circuit or method for protecting the driven circuitry.

Accordingly, embodiments of this disclosure may aim for the propagation delay tap in circuitry that is used to detect the crossing of $V_{detect}$ by $V_{RF}$ to be relatively small (minimized). In this way, the time available for acting on the detection of the crossing of $V_{detect}$ by $V_{RF}$ may be increased (maximized) to include more signal periods in $V_{RF}$:

$$\#\text{periods} = \text{round}((t_{act}-t_{dp}) \cdot \text{frequency})$$

Here, the "round ( )" has been included so as only to take into account those signal periods of which the positive section is finalized.

While FIG. 1 has been presented in the context of the positive peaks in $V_{RF}$ (i.e. $V_{detect}$ is a positive voltage and peaks are detected when $V_{RF} > V_{detect}$), it will be appreciated that embodiments of this disclosure may also be applied negative peaks in $V_{RF}$ (i.e. $V_{detect}$ is a negative voltage and peaks are detected when $V_{RF} < V_{detect}$). Moreover, a protection circuit according to embodiments of this disclosure may be operable to detect both positive and negative peaks in $V_{RF}$. For the purposes of this disclosure, the terms "exceed" and "exceeds" refer to $V_{RF}$ exceeding a detection level $V_{detect}$ in the sense that, for a positive part of the $V_{RF}$ waveform (positive peak), $V_{RF} > V_{detect}$ and/or, for a negative part of the $V_{RF}$ waveform (negative peak), $V_{RF} < V_{detect}$.

Embodiments of this disclosure can provide a protection circuit for protecting driven circuitry against voltage peaks in a radio frequency signal, "$V_{RF}$". In particular, voltage peaks past a predetermined voltage level, "$V_{detect}$", may be detected and acted upon to protect the driven circuitry.

The protection circuit may include a number of features including an input, an amplification stage, a hold circuit and a latch circuit. The input is configured to receive the radio frequency signal. The amplification stage is coupled to the input for receipt of a signal based upon the radio frequency signal received by the input. The radio frequency signal may be processed by the protection circuit prior to being fed to the amplification stage. By way of example, as will be described below in more detail, the radio frequency signal may be biased for maintaining a linear region of the first amplification stage at a desired common mode level.

The amplification stage is operable to produce an amplified signal based on $V_{detect} - V_{RF}$. Further details of the amplification stage will be described below.

The amplified signal may be then be assessed by the hold circuit, to determine whether a peak voltage $V_{peak}$ of the radio frequency signal exceeds $V_{detect}$. The hold circuit may thus make a determination as to whether the peak voltage of the radio frequency signal is exceeding safe levels for preventing damage to the driven circuitry. Based on this assessment, the hold circuit may then output a detection value, indicative of the assessment. In particular, the hold circuit may output a first detection value if $V_{peak}$ exceeds $V_{detect}$, or a second detection value if V peak does not exceed $V_{detect}$.

The latch circuit may then latch the detection value produced by the hold circuit. This latched value may then be used by the protection circuit to, if necessary, take action to prevent damage to the driven circuitry. This action may, for instance, include enabling/disabling an output stage of the protection circuit and/or attenuating the radio frequency signal.

Figure 2:
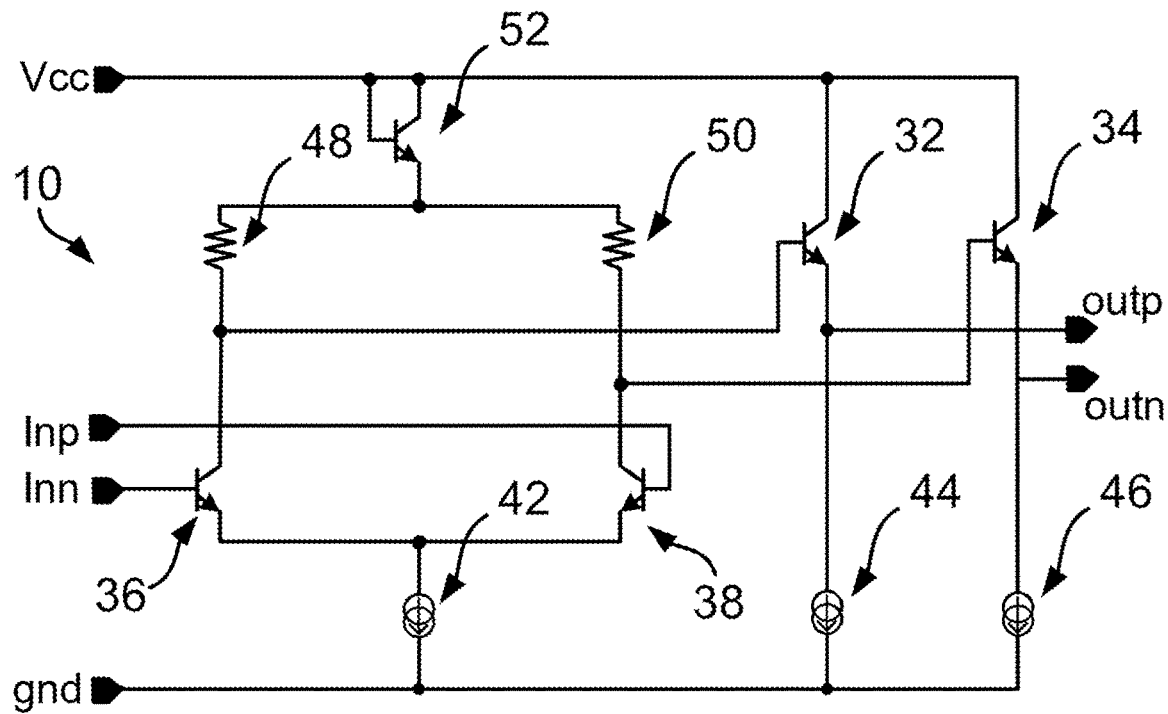
FIG. 2 shows an example of an amplification stage for a protection circuit according to an embodiment of this disclosure.

FIG. 2 shows an example of an amplification stage 10 for a protection circuit according to an embodiment of this disclosure.

The amplification stage 10 includes a first (e.g. positive) input Inp and a second (e.g. negative) input Inn. The first input Inp may be coupled to receive the radio frequency signal from the input of the protection circuit. As will be described below in relation to FIG. 5, the voltage received by the first input Inp may be biased. The second input Inn may be coupled to receive a voltage based on the predetermined voltage level $V_{detect}$.

The amplification stage 10 also includes a first transistor 38 and a second transistor 36. The first input Inp is coupled to a control terminal (e.g. base) of the first transistor 38 and the second input Inn is coupled to a control terminal (e.g. base) of the second transistor 36. A first current terminal (e.g. collector) of each of the first and second transistors 38, 36 may be coupled to a second current terminal (e.g. emitter) of a third transistor 52 via a respective resistor 50, 48. A control terminal (e.g. base) and a first current terminal (e.g. collector) of the third transistor 52 may be coupled to a supply rail Vcc. A second current terminal (e.g. emitter) of each of the first and second transistors 38, 36 may be coupled to a current source 42. The current source 42 may be coupled between the second current terminals of the first and second transistors 38, 36 and a reference voltage, e.g. ground.

The amplification stage 10 further includes a fourth transistor 32 and a firth transistor 34. A first current terminal (e.g. collector) of each of the fourth and fifth transistors 32, 34 may be coupled to the supply rail Vcc. A second current terminal (e.g. emitter) of each of the fourth and fifth transistors 32, 34 may be coupled to a respective current source 44, 46. Each current source 44, 46 may be coupled between the second current terminals of the fourth and fifth transistors 32, 34 and the aforementioned reference voltage (e.g. ground). A control terminal (e.g. base) of the fourth transistor 32 may be coupled to a node located between the second transistor 36 and its respective resistor 48. Similarly, a control terminal (e.g. base) of the fifth transistor 34 may be coupled to a node located between the first transistor 38 and its respective resistor 50.

The amplification stage 10 also includes a first (e.g. positive) output outp and a second (e.g. negative) output outn. The first output outp may be coupled to a node located between the second current terminal of the fourth transistor 32 and its respective current source 44. The second output outn may be coupled to a node located between the second current terminal of the fifth transistor 34 and its respective current source 46.

The components of the amplification stage 10 shown in FIG. 2 may produce a differential output (based on the difference between outp and outn) which is an amplified output based on the signals received by the inputs Inp and Inn. Since Inp and Inn receive signals based on the radio frequency signal and the predetermined voltage level $V_{detect}$, respectively, the differential output of the amplification stage 10 is an amplified signal based on $V_{detect} - V_{RF}$.

The outputs outp and outn may be coupled to the inputs to a further amplification stage 10 of like configuration to the amplification stage 10 shown in FIG. 2, for further amplification of the amplified signal based on $V_{detect} - V_{RF}$. Thus, an number of amplification stages 10 of the kind shown in FIG. 2 may be coupled together in a linear chain, to achieve a desired amount of amplification of the amplified signal based on $V_{detect} - V_{RF}$. It is envisaged that in some embodiments, a single amplification stage 10 may suffice for a given application.

In the case of a protection circuit having a single amplification stage 10, or in the case of a protection circuit having a plurality of amplification stages 10, the outputs outp and outn of a final amplification stage 10 in the linear chain of amplification stages 10 may be coupled to the inputs of a hold circuit of the protection circuit, an embodiment of which will be described below in relation to FIG. 3.

The transistors 36, 38, 52, 32, 34 in the present embodiment are npn bipolar transistors, but it is envisaged that other transistor types may be used.

The circuit described above in relation to FIG. 2 is merely an example of a suitable circuit for implementing an amplification stage 10. In principal, other circuits may be used to implement the amplification stage 10. Such alternative arrangements should be operable to receive the radio frequency signal from the input of the protection circuit and produce an amplified signal based on $V_{detect} - V_{RF}$ which may be outputted to a hold circuit of the protection circuit.

An amplification stage 10 of the kind shown in FIG. 2 (or a linear chain of such amplification stages 10) may reduce propagation delay within the protection circuit while also increasing the bandwidth offered for processing $V_{RF}$ to detect peaks that exceed $V_{detect}$.

In accordance with embodiments of this disclosure, the use of a linear chain comprising multiple amplification stages may improve the bandwidth available for the amplification of the amplified signal based on $V_{detect}-V_{RF}$. The gain bandwidth (GBW) for a single amplification stage may be expressed as:

$$GBW_{n=1,stage} = A \cdot BW$$

where "A" is the low frequency gain and "BW" is the bandwidth, i.e. the frequency where the gain has dropped 3 dB. On the other hand, when multiple amplification stages are coupled together in a linear chain, the gain bandwidth (GBW) available may be expressed as:

$$GBW_{n=n,stage} = \frac{GBW_{n=1,stage}}{A^{\left(1-\frac{1}{n}\right)} \cdot \sqrt{2^{\frac{1}{n}} - 1}} = \frac{A \cdot BW}{A^{\left(1-\frac{1}{n}\right)} \cdot \sqrt{2^{\frac{1}{n}} - 1}}$$

where n is the number of amplification stages. Accordingly, the available bandwidth scales as a factor of the denominator in the equation shown above. In particular, while keeping a fixed total gain A of all (N) amplification stages together, increasing the number of amplification stages will first increase the combined GBW of these N amplification stages. There is generally an optimum number of stages after which the combined GBW drops again.

Another consideration, relating to the propagation delays introduced by using linear chain of amplification stages, is that when the output signal of an amplification stage overdrives the input of a next amplification stage in the linear chain, the propagation delay added by that stage drops substantially, and will in the end stabilize to a fixed amount. Accordingly, overdriving of the inputs of each amplification stage in the linear chain by the outputs of a preceding amplification stage in the linear chain may mitigate the propagation delays introduced by using linear chain of multiple amplification stages.

Figure 3:
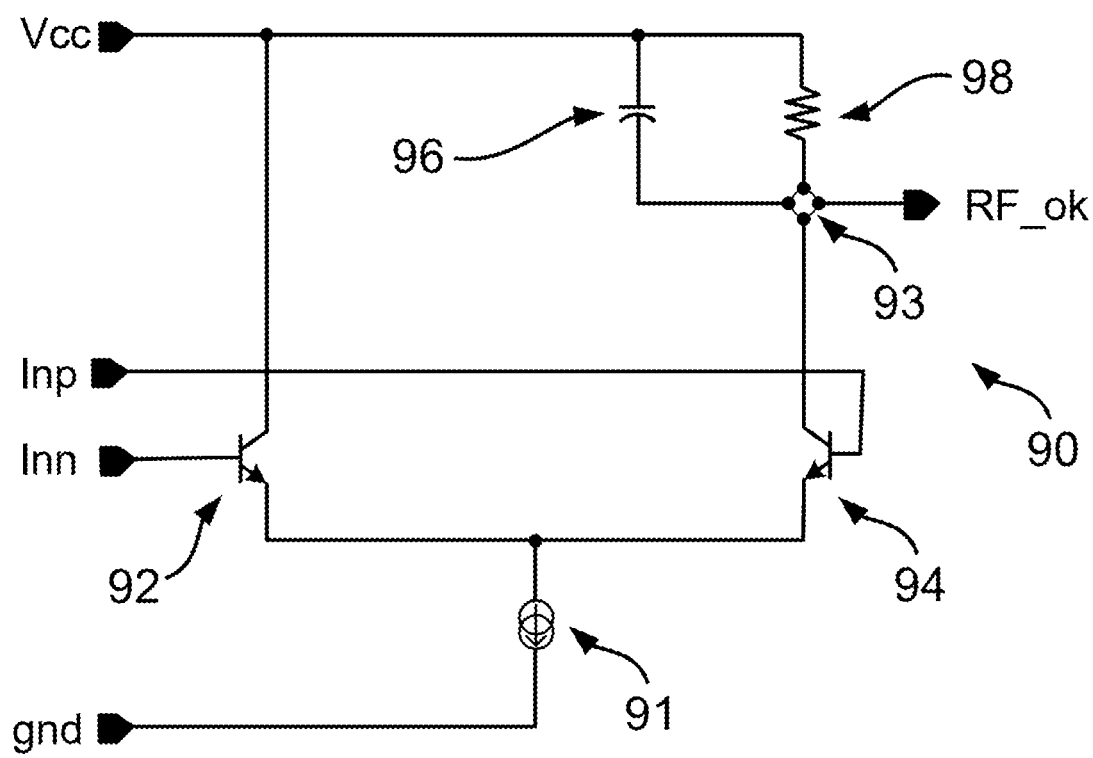
FIG. 3 shows an example of a hold circuit for a protection circuit according to an embodiment of this disclosure.

FIG. 3 shows an example of a hold circuit 90 for a protection circuit according to an embodiment of this disclosure.

The hold circuit 90 includes a first (e.g. positive) input Inp and a second (e.g. negative) input Inn. The first input Inp may be coupled to the first output outp of the amplification stage shown in FIG. 2. The second input Inn may be coupled to the second output outn of the amplification stage 10 shown in FIG. 2. Note that when the protection circuit includes a linear chain of multiple amplification stages 10, the inputs Inp, Inn of the hold circuit 90 may be coupled to the outputs outp, outn of a final amplification stage 10 in the linear chain.

The hold circuit 90 includes a first transistor 94 and a second transistor 92. The first input Inp may be coupled to a control terminal (e.g. base) of the first transistor 94. The second input Inn may be coupled to a control terminal (e.g. base) of the second transistor 92.

A first current terminal (e.g. collector) of the second transistor 92 may be coupled to to a supply rail Vcc.

A second current terminal (e.g. emitter) of each of the first and second transistors 92, 94 may be coupled to a current source 91. The current source 10 may be coupled between the second current terminals of each transistor 92, 94 and a reference voltage, e.g. ground.

The transistors 92, 94 in the present embodiment are npn bipolar transistors, but it is envisaged that other transistor types may be used.

The hold circuit 90 also includes an RC network. The RC network includes a capacitor 96 and a resistor 98. A first terminal of the capacitor 96 and a first terminal of the resistor 98 may be coupled to the supply rail Vcc. A second terminal of the capacitor 96 and a second terminal of the resistor 98 may be coupled together at a common node 93. A first current terminal (e.g. collector) of the first transistor 94 may be coupled to the common node 93.

The hold circuit 90 further includes an output RF_ok, which may be coupled to the common node 93. The output RF_ok may be coupled to a latch circuit of the protection circuit, an embodiment of which will be described below in relation to FIG. 4.

In operation, the hold circuit 90 determines, from the signal received at the inputs Inp, Inn (which, as explained above, is an amplified signal based on $V_{detect}-V_{RF}$ produced by the amplification stage 10 coupled to the hold circuit) whether a peak voltage $V_{peak}$ of the radio frequency signal exceeds $V_{detect}$. According to this determination, the output RF_ok outputs a detection value. In particular, the output RF_ok outputs a first (e.g. negative, low) detection value if $V_{peak}$ exceeds $V_{detect}$, and outputs a second (e.g. positive, high) detection value if $V_{peak}$ does not exceed $V_{detect}$.

The hold circuit 90 shown in FIG. 3 may react quickly to changes in the determination as to whether a peak voltage $V_{peak}$ of the radio frequency signal exceeds $V_{detect}$ and accordingly quickly alter its outputted detection value. This swift detection and output operation may be afforded by the simplicity of the hold circuit 90. The transition between the case in which $V_{RF}$ does not exceed $V_{detect}$ and the case in which $V_{RF}$ docs exceed $V_{detect}$ will be described in more detail below.

In normal operation, $V_{peak}$ of the radio frequency signal $V_{RF}$ will be less than $V_{detect}$. Accordingly, the amplification stage 10 (or linear chain of amplification stages 10) will continuously have a negative output (i.e. outp<outn in FIG. 2). Accordingly, the inputs of the hold circuit 90 will have Inp<Inn, so predominantly all current of the current source 91 will flow through the second transistor 92, hence the output RF_ok of the hold circuit 90 will remain at the second detection value (high, in this embodiment). Note that at this point, the capacitor 96 is uncharged.

If case $V_{RF}$ does cross the $V_{detect}$ level, then the hold circuit 90 will have Inp>Inn for a part of the period of the oscillating radio frequency signal $V_{RF}$ (again, $V_{RF}$ is assumed to be sinusoidal, merely for the purposes of illustration). During this time the output RF_ok will drop because the capacitor 96 is charged by current of the current source 91 that now (partly) flows through the first transistor 94. The resistance of the resistor 98 may be chosen to be high enough such that the output RF_ok signal will not drop significantly before the next pulse in $V_{RF}$ arrives. Accordingly, output RF_ok will continue to drop while each pulse in $V_{RF}$ continues to exceed $V_{detect}$. Subsequently, output RF_ok will reach a value corresponding to the first detection value (low, in this embodiment).

Appropriate selection of the parameters of the RC network (the capacitance of the capacitor 96 and the resistance of the resistor 98) may allow the protection circuit to be tuned according to the desired number of pulses in $V_{RF}$ required (and accordingly the transition time, once the frequency of $V_{RF}$ is considered) for the output RF_ok to transition from the second detection value to the first detection value, when $V_{RF}$ exceeds $V_{detect}$.

Figure 4:
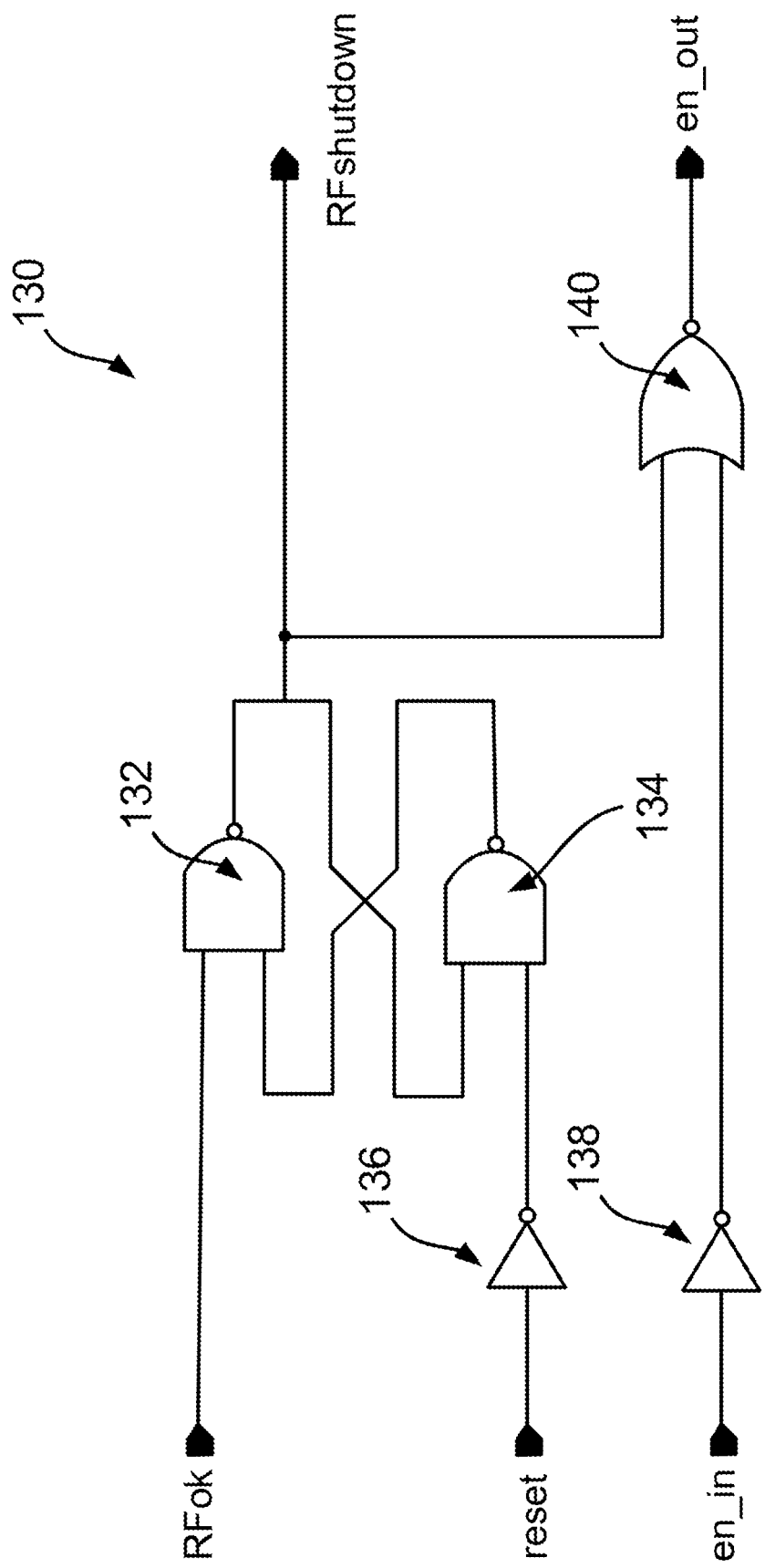
FIG. 4 shows a latch circuit for a protection circuit according to an embodiment of this disclosure.

FIG. 4 shows a latch circuit 130 for a protection circuit according to an embodiment of this disclosure.

The latch circuit 130 has a first input, which is coupled to the output RF_ok of the hold circuit 90 of FIG. 3.

The latch circuit 90 also includes a first NAND gate 132 and a second NAND gate 134. The first and second NAND gates 132, 134 are cross-coupled such that the output of each NAND gate 132, 134 is coupled to one of the inputs of the other NAND gate 134, 132. The first input of the latch circuit 130 is coupled to another of the inputs if the first NAND gate 132, to apply RF_ok to the NAND gate 132. Another of the inputs of the second NAND gate is coupled to a reset input of the latch circuit via a NOT gate 136. Note that the opposite logic value of the value of RF_ok is latched by the latch circuit 130 into the output of the first NAND gate 132 (i.e. the output of the first NAND gate 132 is high when RF_ok is low, and vice versa).

The latch circuit 130 may also include features for acting on the latched value of RF_ok.

For instance, the latch circuit 130 may further include a NOR gate 140. An input of the NOR gate 140 may be coupled to the output of the first NAND gate 132, to receive the latched value of (the logical opposite value of) RF_ok. Another input of the NOR gate 140 may be coupled to an enable input en_in of the latch circuit via a NOT gate 138. An output of the NOR gate may be coupled to an enable output en_out of the latch circuit 130. Note that en_out is low unless the output of the first NAND gate 132 (which is the logical opposite value of RF_ok) is low and en_in is high.

The output en_out may be used to apply a control signal for enabling/disabling an output stage of the protection circuit according to the latched detection value RF_ok. For instance, in this embodiment, when RF_ok is low (indicating that $V_{peak}$ exceeds $V_{detect}$), the latched output of the first NAND gate 132 will be high. On the other hand, when RF_ok is high (indicating that $V_{peak}$ does not exceed $V_{detect}$), the latched output of the first NAND gate 132 will be low. If RF_ok is high and en_in is also high (corresponding to normal operation in which $V_{peak}$ does not exceed $V_{detect}$) then the inputs of the NOR gate 140 will both be low and the output of the NOR gate 140 will be high, providing an enable signal for an output stage of the protection circuit to continue operating. On the other hand, if RF_ok is low (indicating that $V_{peak}$ exceeds $V_{detect}$) then, irrespective of the value of en_in, the output of the NOR gate 140 will be low, providing a disable signal for the output stage of the protection circuit to stop operating. Separately, en_in may be used to enable/disable the output stage of the protection circuit even if RF_ok is high (indicating that $V_{peak}$ does not exceed $V_{detect}$).

Another feature of the latch circuit 130 for acting on the latched value of RF_ok may comprise and RFshutdown output. The RFshutdown output may be coupled to the output of the first NAND gate 132. When RF_ok is high (indicating that $V_{peak}$ does not exceed $V_{detect}$), the RFshutdown output is low, providing an enable signal for an output stage of the protection circuit to continue operating. On the other hand, when RF_ok is low (indicating that $V_{peak}$ exceeds $V_{detect}$), the RFshutdown output is high, providing a disable signal for the output stage of the protection circuit to stop operating. Note that the RFshutdown output in this embodiment simply keys of the value of RF_ok and does not include separate enable/disable functionality using an enable input as per the NOR gate 140 implementation noted above. On the other hand, the RFshutdown output implementation need not introduce a possible delay associated with the NOT gate 138 and the NOR gate 140 into the operation of the enable/disable signal.

Both the NOR gate 140 implementation and the RFshutdown output implementation described above provide an enable/disable to an output stage of the protection circuit, to cease operation of the output stage when RF_ok indicates that $V_{peak}$ exceeds $V_{detect}$. In another implementation, the RFshutdown out and/or the output en_out may be coupled to an attenuator for attenuating the radio frequency signal. For instance, the attenuator may attenuate $V_{RF}$ when the output of the NOR gate 140 is low and/or when the value of RFshutdown is high as described above. In this way, an output stage of the protection circuit need not be disabled when $V_{peak}$ exceeds $V_{detect}$, but $V_{RF}$ may be simply attenuated to avoid damage to the driven circuitry. The attenuator may be programmable, so as to allow the attenuation level to be set according to the protection requirements of the driven circuitry.

While the embodiment of FIG. 4 includes both the NOR gate 140 implementation and the RFshutdown output implementation for acting upon the value of RF_ok, it is envisaged that neither, either, or both of these implementations may be included in a latch circuit according to an embodiment of this disclosure.

Figure 5:
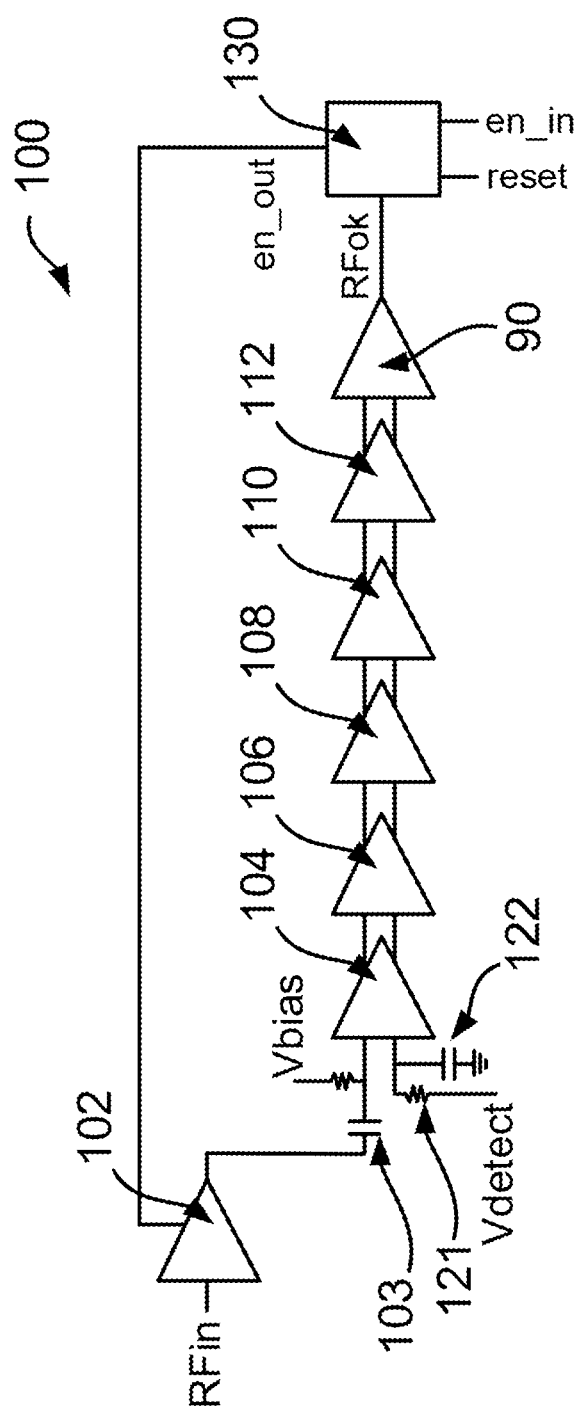
FIG. 5 shows a protection circuit according to an embodiment of this disclosure.

FIG. 5 shows a protection circuit 100 according to an embodiment of this disclosure.

The protection circuit 100 includes an input RFin for receiving the radio frequency signal, $V_{RF}$. In this embodiment, a low noise amplifier 102 is provided for amplifying $V_{RF}$. In some embodiments, the low noise amplifier 102 may be considered to be part of the protection circuit 100, but in other embodiments the low noise amplifier 102 may be considered to be separate from the protection circuit 100.

The protection circuit 100 also includes a linear chain of amplification stages 104, 106, 108, 110, 112. The linear chain may include N amplification stages. In the present embodiment, N=5, although fewer or more amplification stages may be provided in the linear chain. Each amplification stage may be an amplification stage 10 of the kind described above in relation to FIG. 2. Note that each amplification stage 104, 106, 108, 110, 122 may include two inputs and two outputs. As described previously, the inputs of the intermediate stages 106, 108, 110 in the linear chain may be coupled to the outputs of a preceding amplification stage in the linear chain.

A first input (e.g. Inp in FIG. 2) of the first amplification stage 104 in the linear chain may be coupled to the input RFin to receive $V_{RF}$. In this embodiment, the first input of the first amplification stage 104 is coupled to the output of the low noise amplifier 102, whereby the first input of the first amplification stage 104 is coupled to the input RFin via the low noise amplifier 102. A high pass filter capacitor 103 may also be coupled between the output of the low noise amplifier 102 and the first input of the first amplification stage 104.

As shown in FIG. 5 and as mentioned previously, the first input of the first amplification stage 104 may be biased by a voltage Vbias. The bias voltage Vbias may be chosen to maintain a linear region of the first amplification stage at a desired common mode level. The bias voltage Vbias may be programmable, dependent upon the characteristics of the first amplification stage 104 and $V_{RF}$.

A second input (e.g. Inn in FIG. 2) of the first amplification stage 104 may be coupled to receive a signal (voltage) based of $V_{detect}$. A low pass filter capacitor 122 may be used to filter the voltage applied at the second input of the first amplification stage 104. Resistor 121 may be used to offset the value of $V_{detect}$. In this embodiment, the value of $V_{detect}$ is set relative to the value of Vbias. Note that $V_{detect}$ may also be programmable.

The outputs of the first amplification stage 104 are coupled to a next amplification stage 106 in the linear chain.

At the end of the linear chain of amplification stages 104, 106, 108, 110, 112 the outputs of the final amplification stage 112 in the chain are coupled to the inputs of a hold circuit 90. The hold circuit 90 may be a hold circuit of the kind described above in relation to FIG. 3.

The protection circuit 100 further includes a latch circuit 130. The latch circuit 130 may be a latch circuit 130 of the kind described above in relation to FIG. 4. As shown in FIG. 5, and as described above in relation to FIGS. 3 and 4, an output RF_ok of the hold circuit 90 may be coupled to an input of the latch circuit 130, to allow the detection value outputted by the hold circuit 90 to be latched and acted upon. As in FIG. 4, the hold circuit 130 in this embodiment includes a reset input, an enable input en_in and an enable output en_out. The enable output may be coupled to the low noise amplifier 102, for instance to control the low noise amplifier 102 (or an attenuator located in the signal path with the low noise amplifier 102) to attenuate the radio frequency signal $V_{RF}$ in the event that $V_{peak}$ exceeds $V_{detect}$. As described above, the latch circuit 130 may additionally (or alternatively) include an RFshutdown output.

In some embodiments, the protection circuit may be operable to protect driven circuitry against voltage peaks in a radio frequency signal, "$V_{RF}$", past a plurality of different predetermined voltage levels "$V_{detect}$". In this way, multiple different protection voltage levels may be provided (e.g. corresponding to increasing values of $V_{detect}$).

In such embodiments, the protection circuit may include a plurality of respective sets of one or more amplification stages coupled to the input. Each set may include a single amplification stage as described above, or a plurality of amplification stages arranged in a linear chain as described in relation to FIG. 5. Each set of amplification stages may thus produce an amplified signal based on $V_{detect}$-$V_{RF}$ as described above, for each different respective predetermined voltage level.

In such embodiments, the protection circuit may also include a plurality of respective hold circuits. The input of each hold circuit may be coupled to the output of a respective one of the sets of one or more amplification stages as described above. Each hold circuit may therefore determine, from the amplified signal produced a respective one of the sets of one or more amplification stages, whether a peak voltage $V_{peak}$ of the radio frequency signal exceeds the respective predetermined voltage level for that set.

Each hold circuit can then output a first detection value if $V_{peak}$ exceeds $V_{detect}$ for that set of one or more amplification stages, and a second detection value if $V_{peak}$ does not exceed $V_{detect}$ for that set of one or more amplification stages.

In such embodiments, the protection circuit may further include a plurality of respective latch circuits, each operable to latch the detection value outputted by a respective one of the hold circuits.

The arrangement described above, for applying multiple protection levels, may thus be viewed as being an extension of the protection circuit 100 described above in relation to FIG. 5, in which there are a plurality of sets of amplification stages, hold circuits and latches coupled effectively in parallel, each parallel arrangement being assigned to a respective one of the predetermined voltage levels "$V_{detect}$". As such, each parallel arrangement may further include any of the additional details described above in relation to the "single $V_{detect}$" arrangement shown in FIG. 5.

Figure 6:
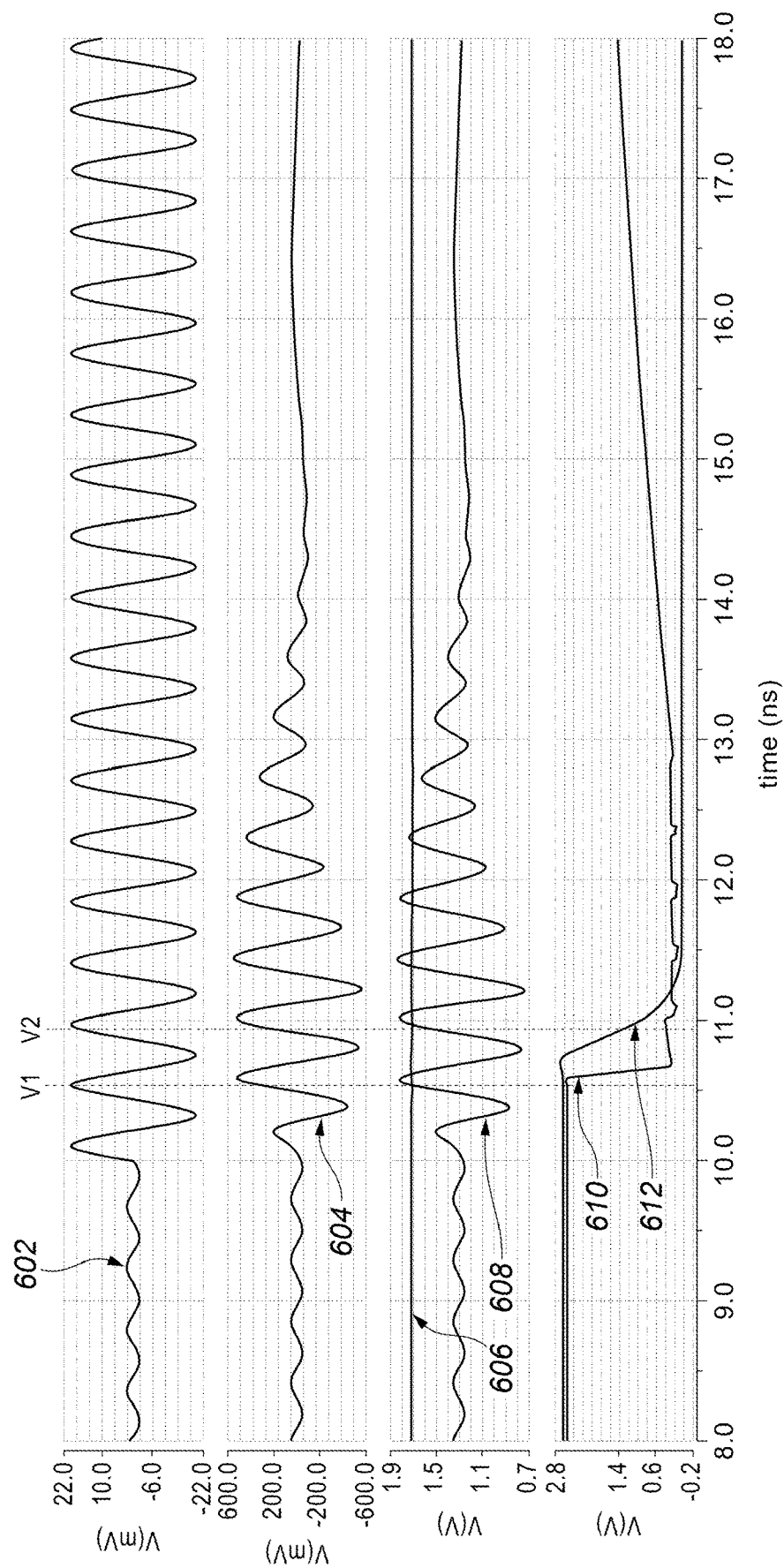
FIG. 6 illustrates the operation of a protection circuit according to an embodiment of this disclosure.

FIG. 6 illustrates the operation of a protection circuit according to an embodiment of this disclosure. In FIG. 6, the following plots are shown:
  Line 602 plots RFin, which is inputted to the low noise amplifier 102 in FIG. 5;
  Line 604 plots the output (RF_out) of the low noise amplifier 102 in FIG. 5;
  Line 606 plots $V_{detect}$ (DC);
  Line 608 plots the radio frequency signal after the high pass filter capacitor 103 (around Vbias level);
  Line 610 plots the output (RF_ok) of the hold circuit 90; and
  Line 612 plots the en_out output signal of the latch 130.

Figure 7:
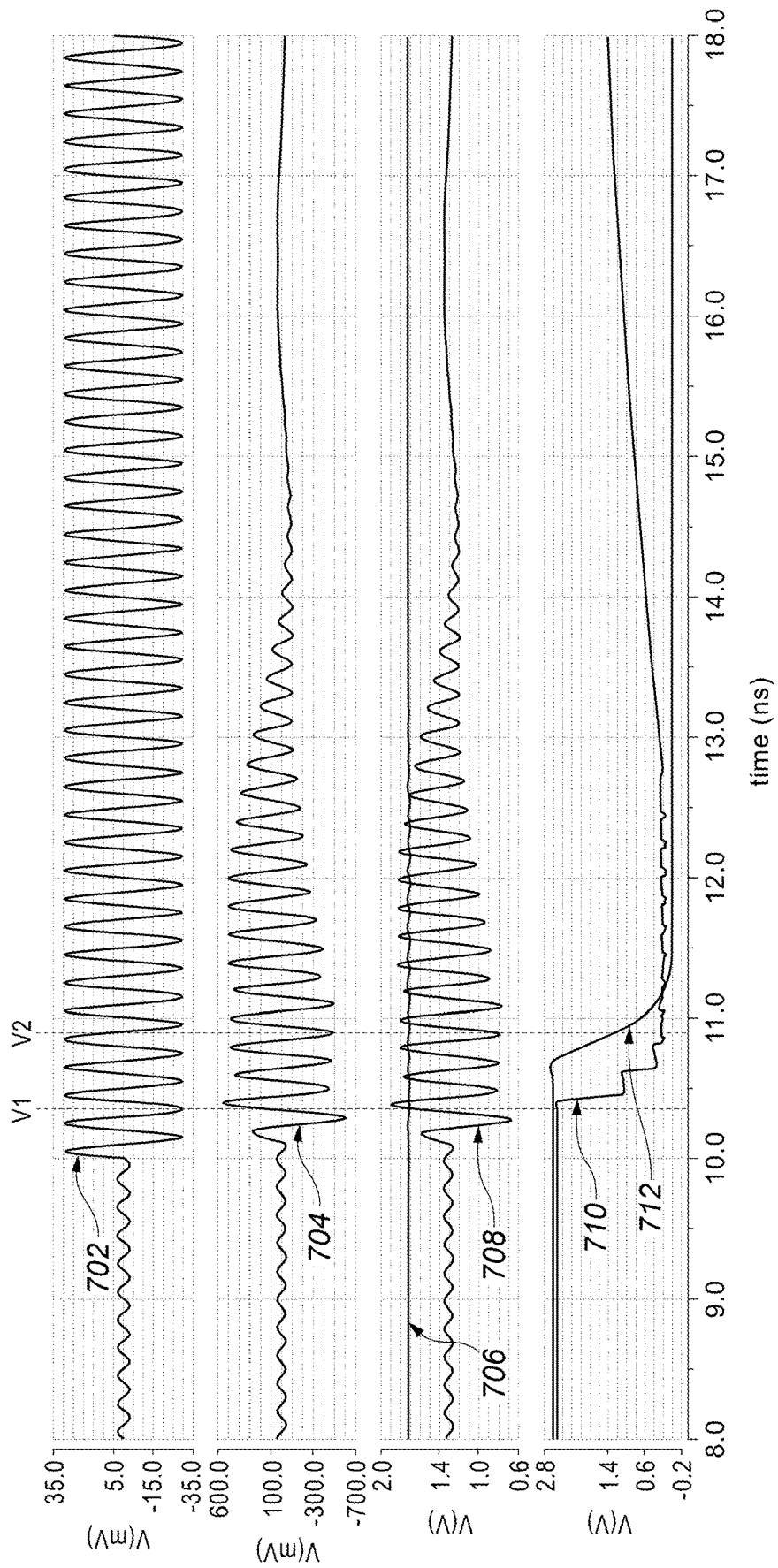
FIG. 7 illustrates the operation of a protection circuit according to an embodiment of this disclosure.

FIG. 7 illustrates the operation of a protection circuit according to an embodiment of this disclosure. In FIG. 7, the following plots are shown:
  Line 702 plots RFin, which is inputted to the low noise amplifier 102 in FIG. 5;
  Line 704 plots the output (RF_out) of the low noise amplifier 102 in FIG. 5;
  Line 706 plots $V_{detect}$ (DC);
  Line 708 plots the radio frequency signal after the high pass filter capacitor 103 (around Vbias level);
  Line 710 plots the output (RF_ok) of the hold circuit 90; and
  Line 712 plots the en_out output signal of the latch 130.

Plots 602, 702 in FIGS. 6 and 7 each show RFin increasing (abruptly, in this example) from a relatively low amplitude to an amplitude which triggers the protection circuit 100. Plots 604, 704 in FIGS. 6 and 7 each show the signal seen by the circuit to be protected (i.e. the output of the low noise amplifier 102 is provided to the circuit to be protected in this embodiment (this connection is not shown in FIG. 5)). Plots 606, 706 and 608, 708 in FIGS. 6 and 7 each show how the output (RF_out) of the low noise amplifier 102 exceeds $V_{detect}$, following the increase in amplitude of RFin. Plots 610 and 710 in FIGS. 6 and 7 each illustrate that embodiments of this disclosure can pull down RF_ok quickly, in reaction to RF_out exceeding $V_{detect}$. In the examples shown in FIGS. 6 and 7, the reaction time of the protection circuit 100 (i.e. from RF_out exceeding $V_{detect}$) is very fast (around 0.6 ns).

Accordingly, there has been described a protection circuit and method for protecting driven circuitry against voltage peaks in a radio frequency signal, "$V_{RF}$", past a predetermined voltage level "$V_{detect}$". The protection circuit includes an input for receiving the radio frequency signal. The protection circuit also includes at least one amplification stage coupled to the input. The amplification stage is operable to produce an amplified signal based on $V_{detect}$-$V_{RF}$. The protection circuit further includes a hold circuit operable to determine, from the amplified signal produced by the amplification stage, whether a peak voltage $V_{peak}$ of the radio frequency signal exceeds $V_{detect}$. The hold circuit is operable to output a first detection value if $V_{peak}$ exceeds $V_{detect}$. The hold circuit is operable to output a second detection value if V peak does not exceed $V_{detect}$. The protection circuit also includes a latch circuit operable to latch the detection value outputted by the hold circuit.

Although particular embodiments of this disclosure have been described, it will be appreciated that many modifications/additions and/or substitutions may be made within the scope of the claims.

The invention claimed is:

1. A protection circuit for protecting driven circuitry against voltage peaks in a radio frequency signal, "$V_{RF}$", past a predetermined voltage level "$V_{detect}$", the protection circuit comprising:
   an input for receiving the radio frequency signal;
   a plurality, N, of amplification stages arranged in a linear chain coupled to the input and configured to produce an amplified signal based on $V_{detect}$-$V_{RF}$, the plurality, N, of amplification stages including:
      a first amplification stage coupled to the input;
      an $N^{th}$ amplification stage having an output operable to output the amplified signal based on $V_{detect}$-$V_{RF}$; and
      at least one intermediate amplification stage coupled between the first amplification stage and the $N^{th}$ amplification stage in the linear chain, wherein each amplification stage of the plurality, N, of amplification stages is a differential amplification stage including a pair of inputs and a pair of outputs; and
   a hold circuit operable to determine, from the amplified signal produced by the at least one amplification stage, whether a peak voltage $V_{peak}$ of the radio frequency signal exceeds $V_{detect}$ and to output:
      a first detection value if $V_{peak}$ exceeds $V_{detect}$; and
      a second detection value if $V_{peak}$ does not exceed $V_{detect}$; and
   a latch circuit operable to latch the detection value outputted by the hold circuit.

2. A method of protecting driven circuitry against voltage peaks in a radio frequency signal, "$V_{RF}$", past a predetermined voltage level "$V_{detect}$", the method comprising:
   receiving the radio frequency signal at an input;
   producing, by a linear chain of N differential amplification stages coupled to the input, an amplified signal based on $V_{detect}$-$V_{RF}$, wherein N is greater than 2;
   outputting, by an $N^{th}$ differential amplification stage of the linear chain of N differential amplification stages, the amplified signal at an output;
   determining, from the amplified signal, whether a peak voltage $V_{peak}$ of the radio frequency signal exceeds $V_{detect}$; and
   latching:
      a first detection value if $V_{peak}$ exceeds $V_{detect}$; and
      a second detection value if $V_{peak}$ does not exceed $V_{detect}$.

3. The method of claim 2, comprising programmably biasing the radio frequency signal for inputting the radio frequency signal into a first differential amplification stage in the linear chain of N differential amplification stages.

4. The method of claim 2, comprising programmably inputting a reference voltage determined by $V_{detect}$ into a first differential amplification stage in the linear chain of N differential amplification stages.

5. The protection circuit of claim 1, wherein the pair of inputs of the first amplification stage include:
   a first input coupled to the input of the protection circuit; and
   a second input coupled to a reference voltage determined by $V_{detect}$.

6. The protection circuit of claim 5, wherein the first input is programmably biasable for maintaining a linear region of the first amplification stage at a desired common mode level.

7. The protection circuit of claim 5, wherein the reference voltage is programmable.

8. The protection circuit of claim 1, wherein the pair of inputs of each intermediate amplification stage are coupled to the pair of outputs of a preceding amplification stage in the linear chain.

9. The protection circuit of claim 1, wherein the hold circuit has a differential input and wherein the pair of outputs of the $N^{th}$ amplification stage are coupled to the differential input of the hold circuit.

10. The protection circuit of claim 1, wherein a low noise amplifier is coupled to receive the radio frequency signal and wherein the amplification stage is coupled to an output of the low noise amplifier.

11. The protection circuit of claim 1, wherein the hold circuit comprises:
   an output for outputting the detection value to the latch circuit, and
   an RC network for setting a transition time of the hold circuit between the second detection value and the first detection value.

12. The protection circuit of claim 11, wherein the RC network includes a capacitor operable, based on the amplified signal outputted by the amplification stage, to:
   remain uncharged while $V_{peak}$ does not exceed $V_{detect}$; and
   charge when $V_{peak}$ exceeds $V_{detect}$, for driving the detection value outputted by the hold circuit to the second detection value over a time period determined by a time constant of the RC network.

13. The protection circuit of claim 1, wherein the latch circuit comprises an output operable to output a control signal for enabling/disabling an output stage of the protection circuit according to the latched detection value.

14. The protection circuit of claim 1, further comprising a programmable attenuator for attenuating the radio frequency signal according to the latched detection value.

15. The method of claim 2, comprising:
   enabling/disabling an output stage of a protection circuit according to the latched detection value, or
   programmably attenuating the radio frequency signal according to the latched detection value.

16. A protection circuit for protecting driven circuitry against voltage peaks in a radio frequency signal, "$V_{RF}$", past a predetermined voltage level "$V_{detect}$", the protection circuit comprising:
   an input for receiving the radio frequency signal;
   a linear chain of N differential amplification stages comprising:
      a first differential amplification stage coupled to the input;
      an $N^{th}$ differential amplification stage having an output operable to output an amplified signal based on $V_{detect}$-$V_{RF}$; and
      at least one intermediate differential amplification stage coupled between the first amplification stage and the $N^{th}$ differential amplification stage in the linear chain; and
   a hold circuit coupled to the output of the $N^{th}$ differential amplification stage to determine, from the amplified signal, whether a peak voltage $V_{peak}$ of the radio frequency signal exceeds $V_{detect}$ and to produce a latched value from said determination for:
      enabling/disabling an output stage of the protection circuit or attenuating the radio frequency signal according to the latched value.

* * * * *